(12) United States Patent
Weng et al.

(10) Patent No.: US 6,927,108 B2
(45) Date of Patent: Aug. 9, 2005

(54) SOLUTION-PROCESSED THIN FILM TRANSISTOR FORMATION METHOD

(75) Inventors: Jian-gang Weng, Corvallis, OR (US); Ravi Prasad, Corvallis, OR (US); Cary G Addington, Albany, OR (US); Man Ho Cheung, Singapore (SG)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/617,114

(22) Filed: Jul. 9, 2003

(65) Prior Publication Data

US 2005/0009248 A1 Jan. 13, 2005

(51) Int. Cl.⁷ .............................................. H01L 21/00
(52) U.S. Cl. ...................................................... 438/164
(58) Field of Search ................................ 438/149–164, 438/758, 761, 763, 767, 779, 782, 789, 790, 690; 257/E21.041, E29.117, E29.202, E29.273, E51.005, E29.151; 216/65, 66, 94; 427/96, 402

(56) References Cited

U.S. PATENT DOCUMENTS

| | | | | |
|---|---|---|---|---|
| 5,824,374 A | * | 10/1998 | Bradley, Jr. et al. | 427/555 |
| 5,981,970 A | * | 11/1999 | Dimitrakopoulos et al. | 257/40 |
| 6,080,606 A | * | 6/2000 | Gleskova et al. | 438/151 |
| 6,087,196 A | * | 7/2000 | Sturm et al. | 438/29 |
| 6,410,368 B1 | | 6/2002 | Kawasaki et al. | |
| 6,602,790 B2 | * | 8/2003 | Kian et al. | 438/690 |
| 6,603,139 B1 | * | 8/2003 | Tessler et al. | 257/40 |
| 6,697,694 B2 | * | 2/2004 | Mogensen | 700/119 |
| 2003/0008224 A1 | | 1/2003 | Fujita et al. | |
| 2003/0047729 A1 | * | 3/2003 | Hirai et al. | 257/40 |
| 2003/0059984 A1 | * | 3/2003 | Sirringhaus et al. | 438/141 |
| 2003/0076048 A1 | | 4/2003 | Rutherford | |
| 2003/0160235 A1 | * | 8/2003 | Hirai | 257/40 |
| 2003/0211649 A1 | * | 11/2003 | Hirai et al. | 438/48 |
| 2003/0226996 A1 | * | 12/2003 | Aramaki et al. | 252/62.3 Q |

FOREIGN PATENT DOCUMENTS

| | | |
|---|---|---|
| WO | WO 02/095805 | 11/2002 |

OTHER PUBLICATIONS

Kenkicki Suzuki, Nobuaki Hayashi, Hiroshi Masuhara, and Thomas K. Lippert, "Ablation Lithography for TFT–LCD", Mat. Res. Soc. Symp. Proc. vol. 685E, 2001 Materials Research Society, pp. D1.2.1–D1.2.10.

Brent A. Ridley, Babak Nivi, Joseph M. Jacobson, "All–Inorganic Field Effect Transistors Fabricated by Printing", www.sciencemag.org, Science, vol. 286, Oct. 22, 1999, pp. 746–749.

Linda T. Creagh, Susanne Heun, Neil Tallant, "Development of Improved Ink Jet Deposition Processes for Polymer OLED Materials", pp. 1–3.

Karel Vanheusden, Klaus Kunze, hugh Denham, Aaron Stump, Allen Schult, Jenny Plakio, and Toivo Kodas, Superior MicroPowders LLC.; Mike Renn, Marcelino Essien, and Bruce King, Optomec Inc., "Direct Printing of Interconnect Materials for Organic Electronics", pp. 1–5.

(Continued)

*Primary Examiner*—George Fourson
*Assistant Examiner*—Brook Kebede

(57) ABSTRACT

An exemplary solution-processed thin film transistor formation method of the invention forms conductive solution-processed thin film material contacts, semiconductor solution-processed thin film material active regions, and dielectric solution-processed thin film material isolations in a sequence and organization to form a solution-processed thin film structure capable of transistor operation. During or after the formation of the transistor structure, laser ablation is applied to one or more of the conductive solution-processed thin film material contacts, the semiconductor solution-processed thin film material active regions and the dielectric solution-processed thin film material isolations to pattern or complete patterning of a material being selectively ablated.

30 Claims, 5 Drawing Sheets

OTHER PUBLICATIONS

D. Schäfer, J. Ihlemann, G. Marowsky, P.R. Herman, "F2–laser ablation patterning of dielectric layers", Applied Physics A, Materials Science & Processing, vol. 72, pp. 372–379 (2001).

H. Sirringhaus, T. Kawase, R.H. Friend, T. Shimoda, M. Inbasekaran, W. Wu, and E.P. W, "High–Resolution Inkjet Printing of All–Polymer Transistor Circuits", www.sciencemag. rg, Science, vol. 290, Dec. 15, 2000, pp. 2123–2126.

J. Norman Bardsley, "International OLED Technology Roadmap: 2001–2010", U.S. Display Consortium.

C. David, T. Neiger, P. Häberling, J. Wei, T. Lippert, and A. Wokaun (PSI), "Laser Ablation Lithography Using Diffractive Phase Masks", Laboratory for Micro– and Nanotechnology, Paul Scherrer Institut, CH–5232, Villigen PSI, PSI annual scientific report 2000.

Hidehik Nonaka, Tetsuya Nishiguchi, Yoshiki Morikawa, Masaharu Miyamoto, and Shingo Ichimura, "Laser Ablation of Solid Ozone", Mat. Res. Soc. Symp. vol. 617, 2000 Materials Research Society, pp. J1.3.1–J1.3.6.

Andrew S. Holmes, "Laser fabrication and assembly processes from MEMS", Imperial College of Science, pp. 1–10.

J.L. Speidell, D.P. Pulaski, and R.S. Patel, "Masks for laser ablation technology: New requirements and challenges".

Symp sium V, "Materials Development f r Direct Write Technologies", vol. 624 of the Materials Research Society Symposium Proceedings Series, Apr. 24–26, 2000, pp. 352–362.

OLED Laser Ablation Tools and OLED Laser Ablation System Features Display pages, www.resonetics.com/display.

D. B. Mitzi, K. Chondroudis, and C. R. Kagan, "Organic–inorganic electronics", IBM Journal of Research and Development, vol. 45, No. 1, 2001, pp. 1–14.

Abstract Dig st: SPIE Conference 4800, Organic Light Emitting Materials and Devic s VI.

Christophe Vaucher, "The Sharper Image—Christopher Vaucher", http://www.circuitree.com/CDA/ArticleInformation/features/BNP_Features_Item/0,2133,28551,00.

* cited by examiner

SOLUTION-PROCESSED THIN FILM TRANSISTOR FORMATION METHOD

FIELD OF THE INVENTION

The invention is in the semiconductor field. The invention particularly concerns solution-processed thin film transistors.

BACKGROUND OF THE INVENTION

Solution-processed thin film transistors hold great promise to fundamentally change the semiconductor industry. Solution-processed, as applied to modify material and thin film and used herein, refers to those materials that are either soluble in a solution or capable of suspension in a solution so they may be processed by a solution technique, e.g., ink jet printing or spin coating, and formed into a thin film. Their uses run the gamut of conventional transistor uses, and may be formed into light emitting structures. Materials used in the thin films, such as conductive polymers, are durable and can be flexible, thereby providing a range of uses in demanding environments.

The solution-processed thin film transistors also hold the potential to be fabricated by simple techniques, e.g., direct printing of circuits. A long-term goal is to have circuits of solution-processed thin film transistors printed on a substrate in similar fashion to the way ink is patterned in a printing press. Proposed manufacturing techniques seek to employ relatively simple procedures such as inkjet printing. A critical issue, however, remains feature size. Small feature sizes, e.g., small channel lengths, produce small threshold voltages and fast operation. However, introducing conventional techniques to produce small feature sizes, e.g., lithography, adds complexity and expense that contradicts the goal of achieving simply manufactured devices and circuits.

Screen printing is an example technique for patterning drain and source regions of solution-processed thin film transistors. A gap of about 100 $\mu$m may be produced by this technique. Other techniques may produce smaller sized gaps, but have limitations such as being limited to use on small substrates. An example is a technique that converts portions of organic polymer materials to dielectric through selective use of UV radiation. Thus, there remains a need for solution-processed thin film formation methods capable of producing small feature sizes.

SUMMARY OF THE INVENTION

An exemplary solution-processed thin film transistor formation method of the invention forms conductive solution-processed thin film contacts, semiconductor solution-processed thin film active regions, and dielectric solution-processed thin film isolations in a sequence and organization to form a solution-processed thin film structure capable of transistor operation. During or after the formation of the transistor structure, laser ablation is applied to one or more of the conductive solution-processed thin film contacts, the semiconductor solution-processed thin film active regions and the dielectric solution-processed thin film isolations to pattern or complete patterning of a material being selectively ablated.

DETAILED DESCRIPTION OF THE PREFERRED EMBODIMENTS

Figure 1A:
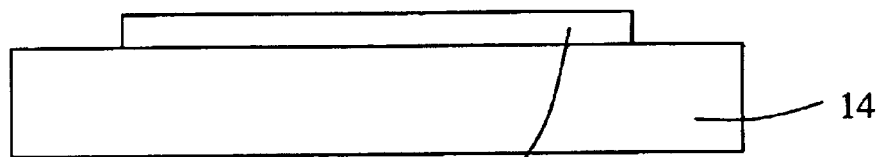
FIGS. 1A–1C are schematic block diagrams illustrating an exemplary embodiment formation method and solution-processed thin film transistor of the invention.

The invention concerns solution-processed thin film transistor formation that makes use of selective laser ablation to remove material as part of a patterning step. Solution-processed, as applied to modify material and thin film and used herein, refers to those materials that are either soluble in a solution or capable of suspension in a solution so they may be processed by a solution technique, e.g., ink jet printing or spin coating, and formed into a thin film. Exemplary categories of solution-processed thin films include organic thin films and polymer thin film categories. The majority of the solution-processed materials that can be formed into thin films are the conductive polymers, semiconductive polymers and dielectric polymers. However, a solution-processed material may also be a precursor of small organic molecular material that is soluble in a solvent. One example is the pentacene precursor that is soluble in chloroform. It can be spin-coated to form a thin film and then heated to reduce to pentacene at temperatures of ~200° C. Pentacene is an organic semiconductor but is not a polymer. Also, there may be inorganics that may be solution-processed to form thin films.

In exemplary embodiments, a solution based processing is used to roughly pattern a portion of a solution-processed thin film transistor being formed. For example, solution processing techniques may form into a rough pattern conductive solution-processed thin film contacts, semiconductor solution-processed thin film active regions, or dielectric solution-processed thin film isolations in a sequence and organization to form a solution-processed thin film structure capable of transistor operation. Patterning of contacts, active regions, or isolations may be refined by selective laser ablation. The ablation is preferably tuned to a wavelength to achieve maximum absorption by the material being ablated and to minimize damage to material under the material being ablated. In other embodiments of the invention, laser ablation is used to completely pattern a contact, active region, or dielectric. In such embodiments, rough patterning in the solution based processing deposition is unnecessary. As an example, conductive polymer material is deposited by solution based processing without a pattern. Selective laser ablation then is used to pattern contacts, e.g., circuit interconnect patterns, in the solution-processed conductive material. The laser radiation may also be directed through an optical mask, permitting the formation of relatively complex patterns simultaneously, e.g., the ablation of multiple channel areas at the same time.

The invention will now be illustrated with respect to exemplary embodiment thin film transistor devices. In describing the invention, particular exemplary devices and device applications will be used for purposes of illustration of the invention, but the invention is not limited to the formation of the particular illustrated devices. Dimensions and illustrated devices may be exaggerated for purposes of illustration and understanding of the invention. Reference numerals may be used in different embodiments to indicate similar features. The elements of the drawings are not necessarily to scale relative to each other. Rather, emphasis has instead been placed upon clearly illustrating the invention. A device illustrated in conventional fashion by a two-dimensional schematic layer structure will be understood by artisans to provide teaching of three-dimensional device structures and integrations.

The exemplary embodiments may be constructed with any combination of solution-processed electronic materials capable of being formed into thin films. By way of example, poly(3,4-ethylenedioxythiophene), also called PEDOT, is a conductive polymer suitable for drain, gate and source contacts. An exemplary suitable semiconductive polymer is poly (3-hexylthiophene-2,5-diyl), also called P3HT. An exemplary dielectric polymer is poly(vinylphenol), also called PVP. Other exemplary polymer materials, like the specific examples, will exhibit the ability to be solution processed and formed into very thin films.

Figure 1B:
Figure 1C:
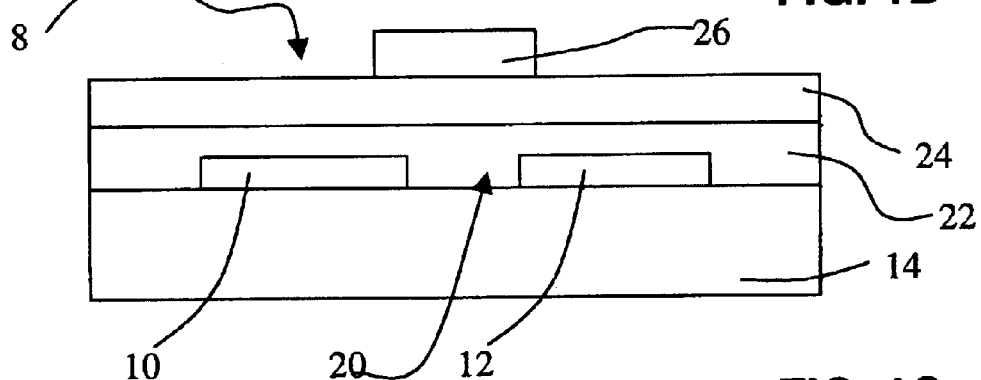

Referring now to FIGS. 1A–1C, an exemplary embodiment formation method and solution-processed thin film transistor 8 of the invention are illustrated. The transistor has source and drain contacts 10, 12 formed upon a substrate 14. The substrate 14 should have good dielectric properties and must be compatible with the solution-processed thin film materials used to form the transistor 8. Suitable exemplary substrates include glass, polycarbonate, polyarylate, polyethylenterephtalate (PET), polyestersulfone (PES), polyimide, polyolefin, and polyethylene naphtthalate (PEN). Initially, conductive solution-processed thin film material 16 is deposited upon the substrate 14, preferably by inkjet printing. As an example, though a single device is illustrated, the conductive solution-processed thin film material 16 may be formed into a rough pattern such as a circuit interconnect pattern used to connect multiple transistors. After a rough patterned deposit of the conductive solution-processed thin film material 16, refined patterning is conducted by laser ablation, as illustrated in FIG. 1B. In FIG. 1B, laser irradiation 18 tuned to a wavelength that will be selectively absorbed by the conductive solution-processed thin film material 16 is used to pattern a transistor channel 20 between the source and drain contacts 10 and 12. To reduce threshold voltage, the channel is preferably made narrow, e.g., less than 5 $\mu$m. Of course, some device architectures permit wider channels, and the maximum channel width is solely dependent upon device architecture. As for minimum channel width, channel widths of less than 1 $\mu$m can be formed with optimization of laser wavelengths and focusing optics depending upon the particular solution-processed materials used. Properly tuned laser radiation will ablate the conductive solution-processed thin film material and have a minimal or no effect on the underlying material, i.e., the substrate 14 in FIGS. 1A–1C.

After the transistor channel is formed 20, a thin film of semiconductor solution-processed thin film material is deposited to form an active region thin film layer 22 over the source and drain contacts and exposed portions of the substrate 14. Semiconductor material deposits into the transistor channel 20 during this part of the formation process. Formation of the thin film layer may be conducted by a suitable solution processed deposition. Spin coating is an exemplary deposition technique. Spin coating is also preferred for the deposition of a dielectric solution-processed thin film material to form an isolation layer 24 over the active region thin film layer 22. Conductive solution-processed thin film material is then deposited upon the isolation layer 24 to form a gate contact 26. The gate contact deposit is preferably by inkjet printing. In addition, there may be a rough deposition of the gate contact 26 followed by selective ablation for refining the pattern. The gate contact 26 may form part of a circuit interconnect pattern, as well.

Figure 2A:
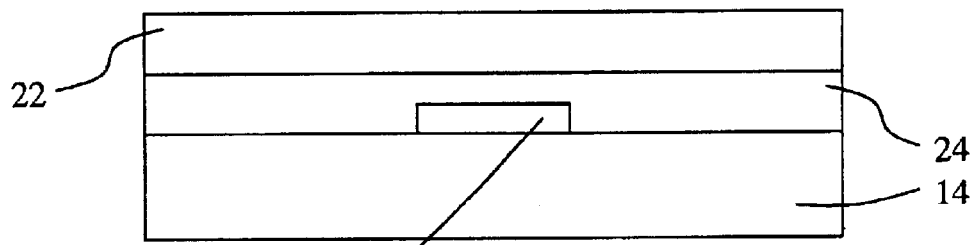
FIGS. 2A–2C are schematic block diagrams illustrating a second exemplary formation method and solution-processed thin film transistor of the invention.
Figure 2B:
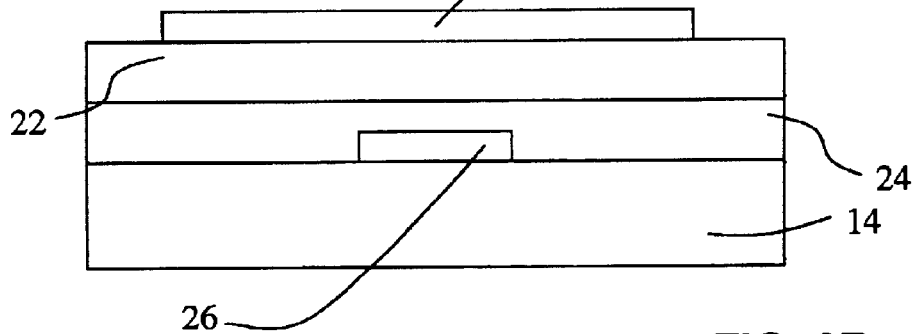
Figure 2C:
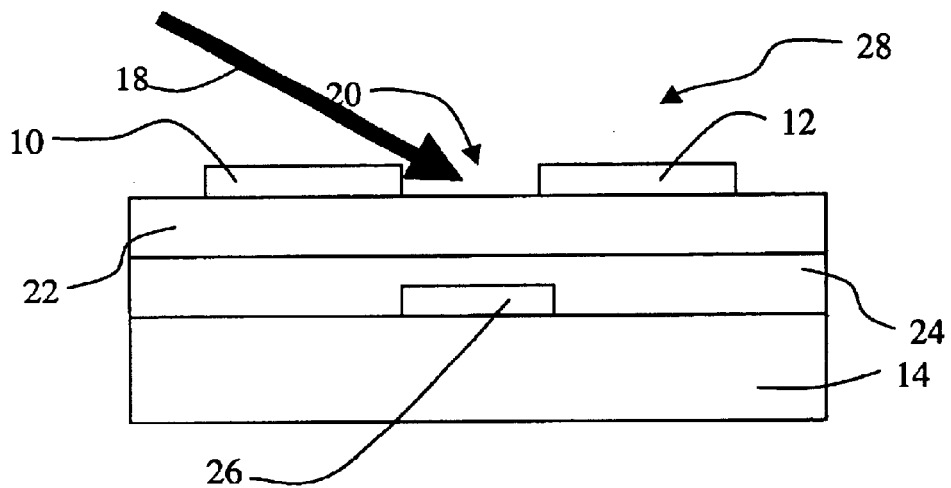

Referring now to FIGS. 2A–2C, a second exemplary embodiment formation method and solution-processed thin film transistor 28 of the invention are illustrated. Initially, conductive solution-processed thin film material is patterned upon the substrate 14 to form a gate contact 26. As in the FIGS. 1A–1C embodiment, the gate contact 26 may be patterned roughly by a deposit and then refined by laser ablation. The gate contact 26 may also form part of a circuit interconnect pattern. A dielectric solution-processed thin film material thin film layer 24 is then formed over the gate contact 26 and exposed portions of the substrate. This is followed by deposit of a semiconductor solution-processed thin film material active region thin film layer 22. Conductive solution-processed thin film material 16 is deposited on the semiconductor active region thin film layer 22. In FIG. 2B, laser irradiation 18 tuned to a wavelength that will be selectively absorbed by the conductive solution-processed thin film material 16 is used to pattern a transistor channel 20 between the source and drain contacts 10 and 12. The transistor channel 20 is understood to operate in the active region thin film layer 22, but the gap between the source and drain contacts 10 and 12 and created by the ablation defines the channel location.

Figure 3A:
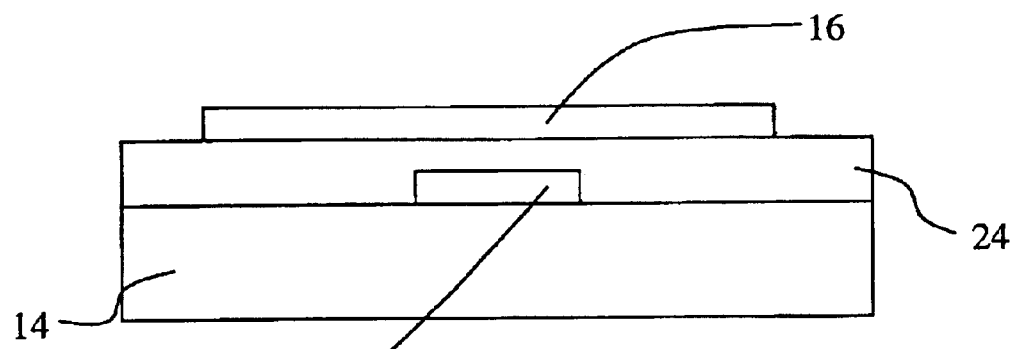
FIGS. 3A–3C are schematic block diagrams illustrating a third exemplary formation method and solution-processed thin film transistor of the invention.
Figure 3B:
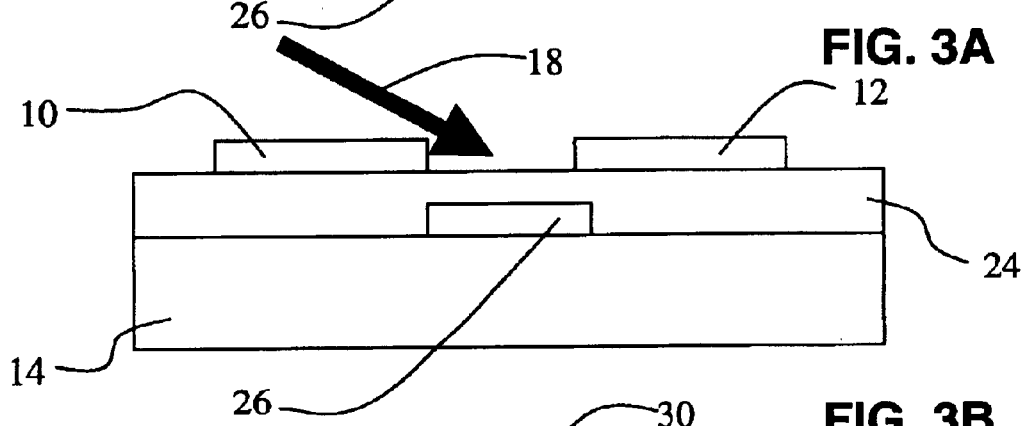
Figure 3C:
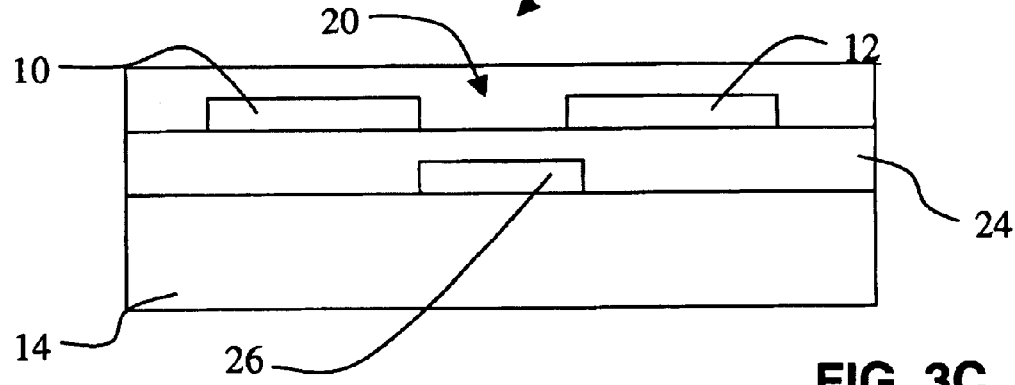

Referring now to FIGS. 3A–3C, a third exemplary embodiment formation method and solution-processed thin film transistor 30 of the invention are illustrated. Initially, conductive solution-processed thin film material is patterned upon the substrate 14 to form a gate contact 26. As in the other embodiments, the gate contact 26 may be patterned roughly by a deposit and then refined by laser ablation. The gate contact 26 may also form part of a circuit interconnect pattern. A dielectric solution-processed thin film material thin film layer 24 is then formed over the gate contact 26 and exposed portions of the substrate. Conductive solution-processed thin film material 16 is deposited on the dielectric solution-processed thin film material layer 24. In FIG. 3B, laser irradiation 18 tuned to a wavelength that will be selectively absorbed by the conductive solution-processed thin film material 16 is used to pattern a transistor channel 20 between the source and drain contacts 10 and 12. A semiconductor solution-processed thin film material is then deposited over the source and drain contacts and exposed portions of the dielectric solution-processed thin film material layer to form semiconductor solution-processed thin film material active region thin film layer 22.

Figure 4A:
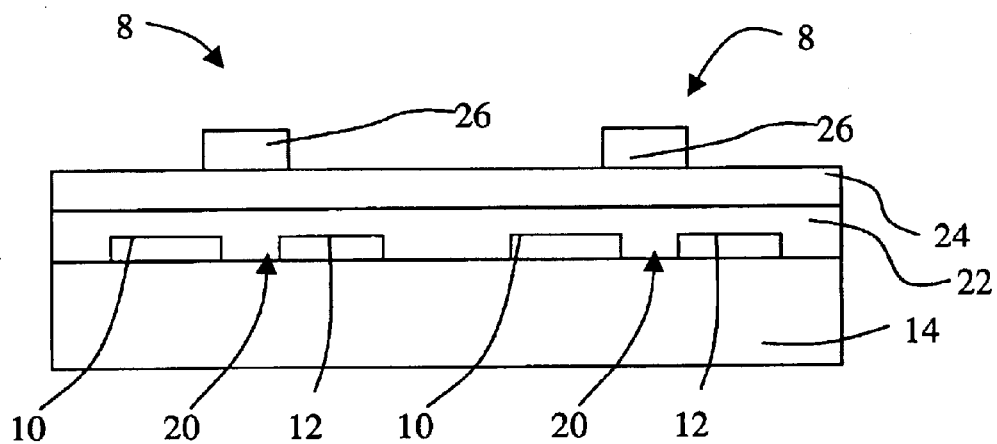
FIGS. 4A and 4B illustrate an exemplary embodiment device isolation step for the FIGS. 1A–1C formation method.
Figure 4B:
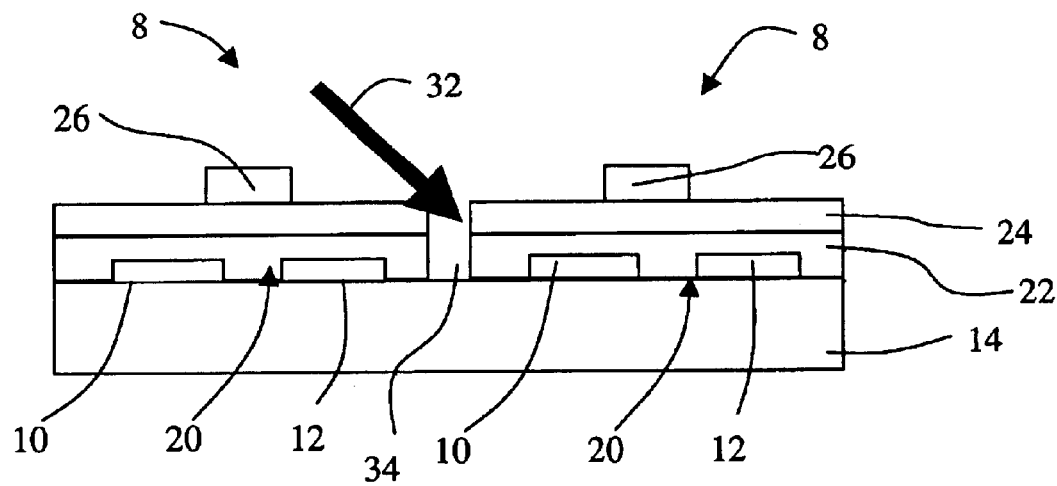
Figure 5:
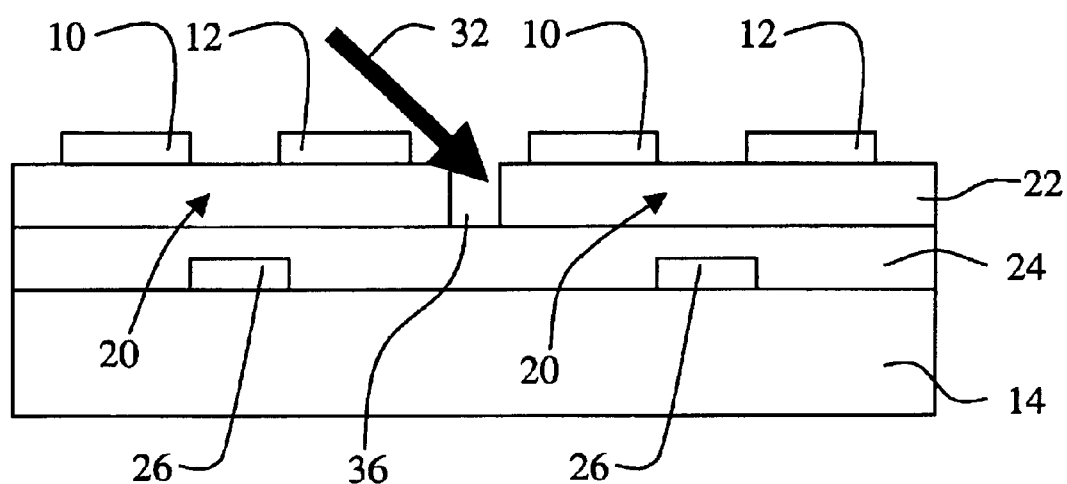
FIG. 5 illustrates an exemplary embodiment device isolation step for the FIGS. 2A–2C formation method.

FIGS. 4A and 4B illustrate an exemplary embodiment device isolation step for the FIGS. 1A–1C formation method. FIG. 4A illustrates two transistor devices 8 formed in accordance with FIGS. 1A–1C. The transistor devices 8 are formed as part of a single integration. In FIG. 4B laser irradiation 32 is tuned and controlled to ablate layers down to the substrate 14. The laser radiation may be varied in intensity or wavelength during the ablation of multiple layers. The ablation thereby creates a device isolation 34. In FIG. 4B, the device isolation takes the form of a gap. The gap may also be filled with isolation material, such as dielectric solution-processed thin film material. FIG. 5 illustrates a device isolation step for two transistor devices 28 formed in accordance with FIGS. 2A–2C. In the exemplary embodiment of FIG. 5, the laser irradiation is tuned and controlled to form a device isolation 36 through the semiconductor layer up to the dielectric solution-processed thin film material layer 24. An optical mask may be used to create multiple features simultaneously, such as multiple device isolations 36. As in FIGS. 4A and 4B, the device isolation takes the form of a gap and also may be filled with isolation material.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A solution-processed thin film transistor formation method, comprising steps of:
   forming conductive solution-processed thin film contacts, semiconductor solution-processed thin film active regions, and dielectric solution-processed thin film isolations in a sequence and organization to form a solution-processed thin film structure capable of transistor operation; and
   selectively ablating one or more of the semiconductor solution-processed thin film active regions and the dielectric solution-processed thin film isolations to pattern or complete patterning of a material being selectively ablated, wherein said step of selectively ablating is carried out during or after said step of forming.

2. The method of claim 1, wherein said step of selectively ablating is applied to complete patterning of a material roughly patterned when deposited.

3. The method of claim 2, wherein the material roughly patterned when deposited is patterned as a result of an inkjet deposition process.

4. The method of claim 2, wherein the material roughly patterned when deposited is patterned as a result of a spin coat deposition process.

5. The method of claim 1, repeated to form a plurality of thin film structures capable of transistor operation and further comprising a step of forming device isolations by ablating material between structures.

6. The method of claim 5, further comprising a step of filling the device isolations with dielectric solution-processed thin film material.

7. The method of claim 5, wherein the conductive solution-processed thin film contacts are patterned to form a circuit interconnect pattern.

8. The method of claim 1, wherein said steps of forming and ablating comprise the following steps:
   depositing drain and source conductive solution-processed thin film material upon a substrate;
   selectively ablating a transistor channel in the drain and source conductive solution-processed thin films to form drain and source contacts;
   depositing active region semiconductor solution-processed thin film material over the drain and source contacts and the substrate;
   depositing isolation region dielectric solution-processed thin film material over the semiconductor solution-processed thin film material; and
   depositing gate conductive solution-processed thin film material upon the isolation region dielectric to form a gate contact.

9. The method of claim 8, wherein said steps of depositing drain and source conductive solution-processed thin film material and depositing gate conductive material solution-processed thin film material comprise inkjet printing conductive solution-processed thin film material.

10. The method of claim 9, wherein:
    said step of depositing active region semiconductor solution-processed thin film material comprises spin coating dielectric solution-processed thin film material; and
    said step of depositing isolation region dielectric solution-processed thin film material comprises spin coating dielectric solution-processed thin film material.

11. The method of claim 8, wherein the transistor channel is formed to be 5 $\mu$m or less wide.

12. The method of claim 1, wherein said steps of forming and ablating comprise the following steps:
    depositing gate conductive solution-processed thin film material upon a substrate;
    depositing isolation region dielectric solution-processed thin film material over the gate conductive solution-processed thin film material and the substrate;
    depositing active region semiconductor solution-processed thin film material over the isolation region dielectric; and
    depositing drain and source conductive solution-processed thin film material upon the active region semiconductor solution-processed thin film material; and
    selectively ablating a transistor channel in the drain and source conductive solution-processed thin film material to form drain and source contacts.

13. The method of claim 12, wherein said steps of depositing drain and source conductive solution-processed thin films and depositing gate conductive solution-processed thin film materials comprise inkjet printing conductive solution-processed thin film material.

14. The method of claim 13, wherein:
    said step of depositing active region semiconductor solution-processed thin film material comprises spin coating semiconductor solution-processed thin film material and
    said step of depositing isolation region dielectric solution-processed thin film material comprises spin coating dielectric solution-processed thin film material.

15. The method of claim 1, wherein said steps of forming and ablating comprise the following steps:
    depositing gate conductive solution-processed thin film material upon a substrate;
    depositing isolation region dielectric solution-processed thin film material over the gate conductive solution-processed thin film material and the substrate;
    depositing drain and source conductive solution-processed thin film material upon the isolation region dielectric solution-processed thin film material;
    selectively ablating a transistor channel in the drain and source conductive solution-processed thin film material to form drain and source contacts;
    depositing active region semiconductor solution-processed thin film material over the drain and source conductive solution-processed thin film material and the isolation dielectric.

16. The method of claim 15, wherein said steps of depositing source and source drain conductive solution-processed thin films and depositing gate conductive solution-processed thin film material comprise inkjet printing conductive solution-processed thin film material.

17. The method of claim 16, wherein;
said step of depositing active region semiconductor solution-processed thin film material comprises spin coating semiconductor solution-processed thin film material; and
said step of depositing isolation region dielectric solution-processed thin film material comprising spin coating dielectric solution-processed thin film material.

18. The method of claim 1, wherein said step of selectively ablating uses a laser wavelength tuned to be absorbed by material being ablated and to minimally damage material underlying material being ablated.

19. The method of claim 1, wherein said step of selectively ablating is conducted through an optical mask to ablate multiple features simultaneously.

20. The method of claim 1, wherein said step of selectively ablating is carried out while varying one or both of a laser wavelength and intensity.

21. A solution-processed thin film transistor formation method, comprising steps of:
forming solution-processed thin film layers into a transistor structure wherein the transistor structure includes a semiconductor solution-processed thin film active region, and a dielectric solution-processed thin film isolation; and
during said forming, patterning the semiconductor solution-processed thin film active region and the dielectric solution-processed thin film isolation via laser ablation, using laser wavelength tuned to be absorbed by material being patterned and to minimally damage material underlying material being patterned.

22. The method of claim 21, wherein said step of patterning is applied to complete patterning of a material roughly patterned when deposited.

23. The method of claim 22, wherein the material roughly patterned when deposited is patterned as a result of an inkjet deposition process.

24. The method of claim 22, wherein the material roughly patterned when deposited is patterned as a result of a spin coat deposition process.

25. The method of claim 21, repeated to form a plurality of thin film structures capable of transistor operation and further comprising a step of forming device isolations by ablating material between structures.

26. The method of claim 25, further comprising a step of filling said device isolations with dielectric solution-processed thin film material.

27. The method of claim 21, wherein said step of patterning is conducted through an optical mask to ablate multiple features simultaneously.

28. The method of claim 21, wherein said step of patterning is carried out while varying one or both of a laser wavelength and intensity.

29. The method of claim 1, wherein selectively ablating includes a conductive solution-processed thin film contact.

30. The method of claim 21, wherein the transistor structure includes a solution-processed thin film contact.

* * * * *